(12) United States Patent
Plat et al.

(10) Patent No.: US 6,534,418 B1
(45) Date of Patent: Mar. 18, 2003

(54) USE OF SILICON CONTAINING IMAGING LAYER TO DEFINE SUB-RESOLUTION GATE STRUCTURES

(75) Inventors: Marina V. Plat, San Jose, CA (US); Scott A. Bell, San Jose, CA (US); Christopher F. Lyons, Fremont, CA (US); Ramkumar Subramanian, Sunnyvale, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/845,656

(22) Filed: Apr. 30, 2001

(51) Int. Cl.[7] .............................................. H01L 21/302
(52) U.S. Cl. ........................ 438/739; 438/725; 438/736
(58) Field of Search .................................. 438/703, 717, 438/724, 725, 736, 739, 744, 745, 947, 950, 584, 585

(56) References Cited

U.S. PATENT DOCUMENTS

| 5,264,076 A | 11/1993 | Cuthbert et al. |
|---|---|---|
| 5,346,587 A | 9/1994 | Doan et al. |
| 5,773,199 A | 6/1998 | Linliu et al. |
| 5,804,088 A | 9/1998 | McKee |
| 5,837,428 A | 11/1998 | Huang et al. |
| 5,858,621 A | 1/1999 | Yu et al. |
| 5,883,011 A | 3/1999 | Lin et al. |
| 6,080,678 A | 6/2000 | Yim |
| 6,096,659 A * | 8/2000 | Gardner et al. ............. 438/736 |
| 6,136,679 A | 10/2000 | Yu et al. |
| 6,156,629 A | 12/2000 | Tao et al. |

* cited by examiner

Primary Examiner—Kamand Cuneo
Assistant Examiner—Lisa Kilday
(74) Attorney, Agent, or Firm—Foley & Lardner

(57) ABSTRACT

An exemplary method of using silicon containing imaging layers to define sub-resolution gate structures can include depositing an anti-reflective coating over a layer of polysilicon, depositing an imaging layer over the anti-reflective coating, selectively etching the anti-reflective coating to form a pattern, and removing portions of the polysilicon layer using the pattern formed from the removed portions of anti-reflective coating. Thus, the use of thin imaging layer, that has high etch selectivity to the organic underlayer, allows the use of trim etch techniques without a risk of resist erosion or aspect ratio pattern collapse. That, in turn, allows for the formation of the gate pattern with widths less than the widths of the pattern of the imaging layer.

20 Claims, 2 Drawing Sheets

USE OF SILICON CONTAINING IMAGING LAYER TO DEFINE SUB-RESOLUTION GATE STRUCTURES

CROSS REFERENCE TO RELATED APPLICATIONS

The present application is related to U.S. patent application Ser. No. 09/845,649, entitled BI-LAYER TRIM ETCH PROCESS TO FORM INTEGRATED CIRCUIT GATE STRUCTURES, and U.S. patent application Ser. No. 09/845,654, entitled METHOD OF ENHANCING GATE PATTERNING PROPERTIES WITH REFLECTIVE HARD MASK, both of which were filed on the same day by the same inventors and assigned to the same assignee as this application.

FIELD OF THE INVENTION

The present specification relates generally to integrated circuits and methods of manufacturing integrated circuits. More particularly, the present invention relates to use of silicon containing imaging layers to define gate structures.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC.

One limitation to achieving smaller sizes of IC device features is the capability of conventional lithography. Lithography is the process by which a pattern or image is transferred from one medium to another. Conventional IC lithography uses ultra-violet (UV) sensitive photoresist. Ultra-violet light is projected to the photoresist through a reticle or mask to create device patterns on an IC. Conventional IC lithographic processes are limited in their ability to print small features, such as contacts, trenches, polysilicon lines or gate structures.

Generally, conventional lithographic processes (e.g., projection lithography and EUV lithography) do not have sufficient resolution and accuracy to consistently fabricate small features of minimum size. Resolution can be adversely impacted by a number of phenomena including: wavelength of light, diffraction of light, lens aberrations, mechanical stability, contamination, optical properties of resist material, resist contrast, resist swelling, thermal flow of resist, etc. As such, the critical dimensions of contacts, trenches, gates, and, thus, IC devices, are limited in how small they can be.

Another difficulty arising from the continuing small dimensions involved in the creation of gate structures is the tendency in the lithography process to experience resist erosion and pattern collapse during trim etch processes. During trim etch processes, a significant amount of the resist is normally etched away in a vertical direction, resulting in a substantial weakening and thinning of the photoresist. This significant reduction of the vertical dimension or thickness of the photoresist from its untrimmed vertical dimension can promote discontinuity thereof, resulting in the photoresist being incapable of providing effective masking in the fabrication of the gate. The resist thickness erosion occurs during etch processes.

Thus, there is a need to pattern IC devices using non-conventional lithographic techniques. Further, there is a need to prevent resist erosion and pattern collapse during trim etch processes. Yet further, there is a need to use imaging layers to define gate structures having small critical dimensions.

SUMMARY OF THE INVENTION

An exemplary embodiment is related to a method of fabricating an integrated circuit (IC). This method can include depositing an inorganic underlayer on top of polysilicon, depositing an imaging layer over the inorganic underlayer, patterning the imaging layer, using the imaging layer as a hard mask to selectively trim etch the inorganic underlayer with an isotropic etch in a controlled manner in a high-density plasma etching system to form a pattern, removing the hard mask imaging layer, and etching the portions of the polysilicon layer using the pattern formed by the inorganic underlayer.

Another exemplary embodiment is related to a method of forming a gate in an integrated circuit. This method can include providing a gate material layer, providing a hard mask layer over the gate material layer, etching the hard mask layer with an undercutting technique, and etching the gate material layer to form gate structures.

Another exemplary embodiment is related to a method of preventing resist erosion and pattern collapse during a trim etch process in the manufacture of a gate structure. This method can include depositing an inorganic hard mask material layer over a polysilicon layer, providing a silicon-containing imaging layer over the inorganic hard mask material layer, patterning the silicon-containing imaging layer according to a pattern of gate structures, removing portions of the inorganic hard mask material layer uncovered by the patterned imaging layer, and removing portions of the polysilicon layer uncovered by the unremoved portions of the inorganic hard mask material layer to form gate structures. The inorganic hard mask material layer has a pattern with widths less than widths of the pattern of the imaging layer.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
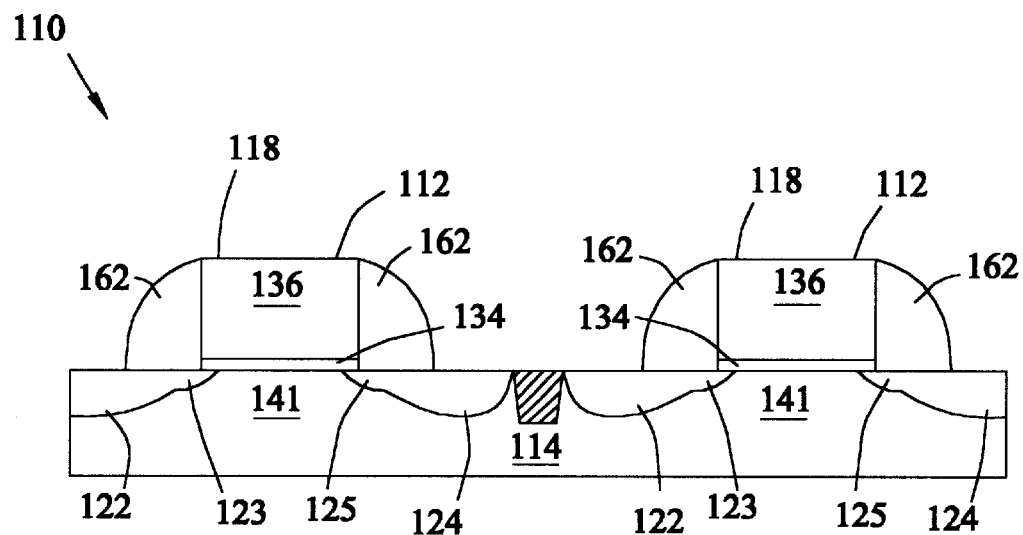
FIG. 1 is a schematic cross-sectional view representation of a portion of an integrated circuit fabricated in accordance with an exemplary embodiment.

With reference to FIG. 1, a portion 110 of an integrated circuit (IC) includes a transistor 112 which is disposed on a semiconductor substrate 114, such as, a wafer. Semiconductor substrate 114 is preferably a bulk P-type single crystalline (001) silicon substrate. Alternatively, substrate 114 can be an N-type well in a P-type substrate, an insulative substrate, a semiconductor-on-insulator (SOI) substrate, (preferably silicon-on-glass) or other suitable material for transistor 112.

Transistor 112 can be a P-channel or N-channel metal oxide semiconductor field effect transistor (MOSFET). Transistor 112 is preferably embodied as a MOSFET and includes a gate structure 118, a source region 122, and a drain region 124. Gate structure 118 advantageously includes single crystalline material that reduces variability in gate lengths due to grain structure. In one embodiment, gate structure 118 has a gate length between source region 122 and drain region 124 in the nanometer scale.

For an N-channel transistor, regions 122 and 124 are heavily doped with N-type dopants (e.g., $5 \times 10^{19} - 1 \times 10^{20}$ dopants per cubic centimeter). For a P-channel transistor, regions 122 and 124 are heavily doped with P-type dopants ($5 \times 10^{19} - 1 \times 10^{20}$ dopants per cubic centimeter). An appropriate dopant for a P-channel transistor is boron, boron diflouride, or iridium, and an appropriate dopant for an N-type transistor is arsenic, phosphorous, or antimony.

Source and drain regions 122 and 124 can be provided with extensions 123 and 125. Preferably, ultra-shallow extensions 123 and 125 (e.g., junction depth is less than 20 nanometers (nm), 100–250 Å) are integral with regions 122 and 124. Source and drain extensions 123 and 125 can be disposed partially underneath gate structure 118.

A channel region 141 underneath gate structure 118 separates regions 122 and 124. Region 141 can be doped according to device parameters. For example, region 141 can be doped according to a super steep retrograded well region.

Gate stack or structure 118 includes a gate conductor 136 and a gate dielectric layer 134. Alternatively, structure 118 can include three or more conductive or semiconductive layers.

Gate conductor 136 is preferably a polysilicon material. Gate conductor 136 has a thickness of 800–1600 Å and a width of less than 50 nm (e.g., channel length). Gate conductor 136 can be a semiconductor material implanted with dopants, with other semiconductive materials or can be an in situ doped material. Gate conductor 136 is also preferably heavily doped with an N-type dopant, such as phosphorous (P), arsenic (As) or other dopant. Alternatively, gate conductor 136 can be doped with a P-type dopant, such a boron (B), boron diflouride ($BF_2$), or other dopant.

Dielectric layer 134 is preferably a 15 to 25 Å thick thermally grown silicon dioxide layer. Alternatively, layer 134 can be a silicon nitride layer. Dielectric layer 134 can be comprised of a high-k dielectric material such as a 2–10 nm thick conformal layer of tantalum pentaoxide ($Ta_2O_5$), aluminum oxide ($Al_2O_3$), titanium dioxide ($TiO_2$) or other material having a dielectric constant (k) over 8.

A silicide layer can be disposed above source region 122, drain region 124, and conductor 136. Preferably, a nickel silicide ($WSi_x$) is utilized. Alternatively, the silicide layer can be any type of refractory metal and silicon combination, such as, a cobalt silicide, tungsten silicide, titanium silicide, or other silicide material.

Transistor 112 can be a n N-channel or a P-channel field effect transistor, such as, a metal oxide semiconductor field effect transistor (MOSFET). Transistor 112 is at least partially covered by insulative layer 148 and is preferably part of an ultra-large scale integrated (ULSI) circuit that includes one million or more transistors.

Spacers 162 are preferably silicon nitride spacers and have a height of 800–1600 Å and a width of 400–600 Å. Spacers 162 abut side walls of conductor 136 and layer 134.

With reference to FIGS. 1–4, the fabrication of transistor 112, including gate conductor 136 is described as follows. The advantageous process allows gate structure to have a small critical dimension, such as, 300–1000 Angstroms. Further, the process described with respect to FIGS. 1–4 prevents resist erosion and pattern collapse during the trim etch process.

Figure 2:
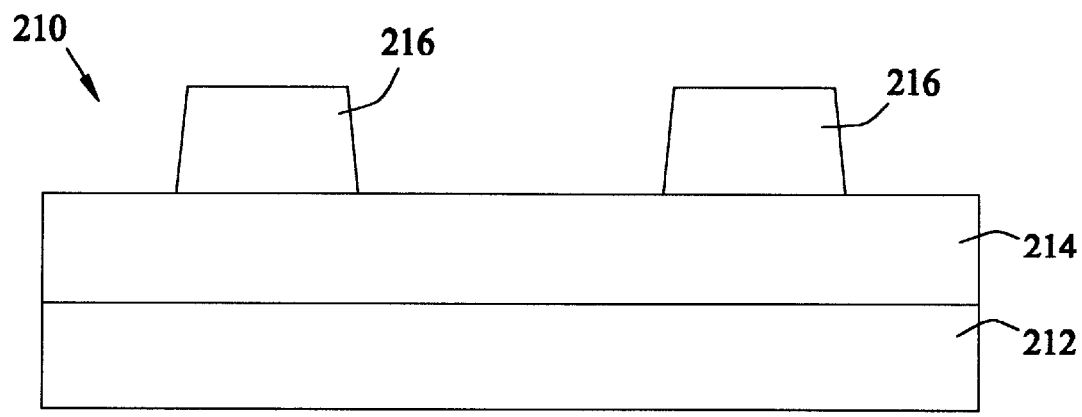
FIG. 2 is a schematic cross-sectional view representation of a portion of an integrated circuit, showing a deposition step.
Figure 3:
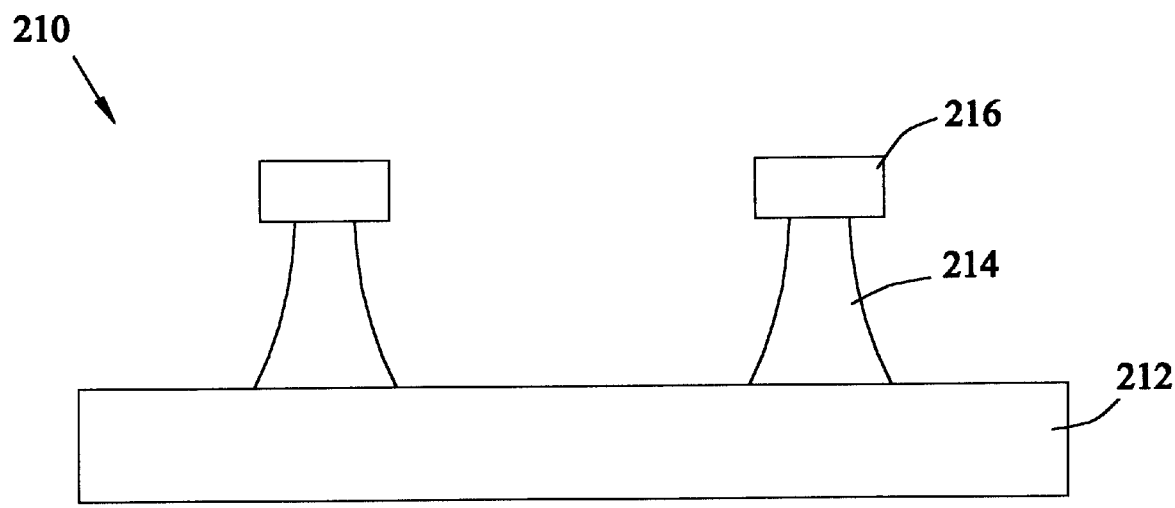
FIG. 3 is a perspective cross-sectional view representation of a portion of an integrated circuit, showing an etching step.

Referring now to FIG. 2, a schematic cross-sectional view representation of a portion 210 of an integrated circuit (IC) includes a polysilicon layer 212, an inorganic anti-reflective coating (ARC) or hard mask 214, and an imaging layer 216. Portion 210 is preferably part of an ultra-large-scale integrated (ULSI) circuit having millions or more transistors. Portion 210 is manufactured as part of the IC on a semiconductor wafer, such as, a silicon wafer.

Polysilicon layer 212 can be any of a variety of materials which can serve as a portion of a gate structure 118 (FIG. 1). In an exemplary embodiment, polysilicon layer 212 can have a thickness of 500–1000 Angstroms. Alternatively, polysilicon layer 212 can be other materials suitable for gate conductor 136. Polysilicon layer 212 can be a refractory metal or a single crystalline semiconductor material. Layer 212 can be in-situ doped or doped subsequently. In one embodiment, polysilicon layer 212 is an 800–1600 Angstrom polycrystalline layer deposited by chemical vapor deposition (CVD) or sputter deposition.

Inorganic ARC or hard mask layer 214 can be SiN, SION, SiRN, or any other suitable material having appropriate anti-reflective properties. Hard mask layer 214 is located above polysilicon layer 212. In an exemplary embodiment, hard mask layer 214 has a thickness of 100–1000 Angstroms.

Imaging layer 216 can be a silicon containing photo-image capable material, or any other material that has slower etch rates than underlying hard mask/arc layer 214. In one embodiment, imaging layer 216 has very different etch properties as compared to layers beneath it. Imaging layer 216 is very thin and has good imaging properties. In an exemplary embodiment, imaging layer 216 has a thickness of 100–1000 Angstroms. Once imaging layer 216 has been patterned by exposing portions of it to light (through a mask, for example) and developed, it can be used as an etch hard mask for etching underlayers (e.g., inorganic layer 214). This forms a desired pattern on the top imaging layer, as seen in FIG. 2, for example.

The patterns formed can be precisely transferred to inorganic layer 214 using imaging layer 216 as a hard mask or as an etching mask to pattern inorganic layer 214. The image in inorganic layer 214 is formed using trim etch techniques. A trim etch slims the inorganic line formed by imaging layer 216 using an isotropic etch in a controlled manner in a high-density plasma etching system.

After layer 214 is formed to a desired thickness, imaging layer 216 is removed using selective Silicon etch or wet stripping techniques. Advantageously, the pattern created includes widths which are less than one lithographic feature.

Figure 4:
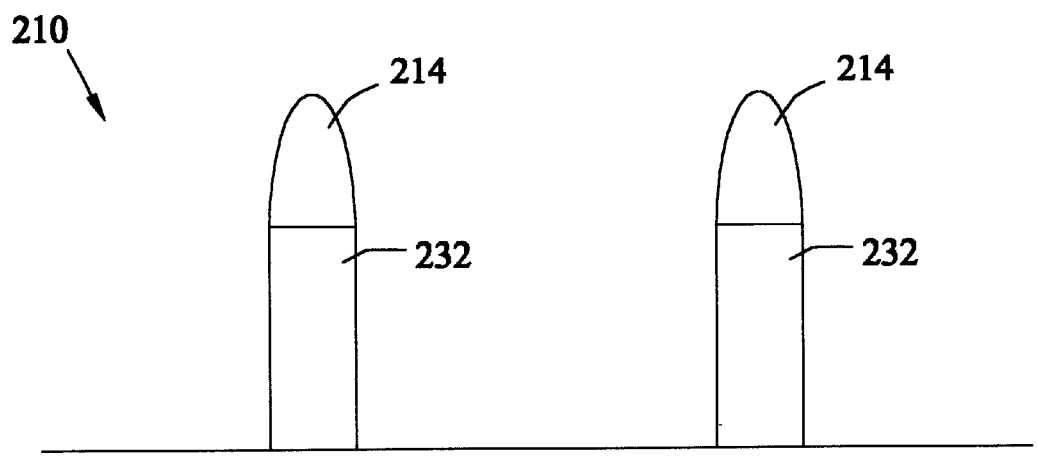
FIG. 4 is a perspective cross-sectional view representation of a portion of an integrated circuit, showing a gate structure formation step.

Referring now to FIG. 4, polysilicon layer 212 is selectively etched using remaining portions of hard mask layer 214. Remaining portions of polysilicon layer 212 can serve as gate structures 232. Advantageously, gate structures 232 have a width or critical dimension of 30–100 nm. Gate structures 232 correspond to gate structure 118 described with reference to FIG. 1.

Referring again to FIG. 1, source and drain regions 122 and 124 are formed in substrate 114, extensions 123 and 125 are formed, a silicide layer is deposited, and spacers 162 are provided. In another exemplary embodiment, additional features are formed during the integrated circuit fabrication process.

The process described with reference to FIGS. 1–4 involves use of an imaging layer 216. Advantageously, imaging layer 216 provides a gate fabrication process which prevents resist erosion and pattern collapsing during trim etch processes. As such, gate structures can be formed with smaller critical dimensions and in a less costly manner (due to the prevention of resist erosion and pattern collapsing).

While the exemplary embodiments illustrated in the figures and described above are presently preferred, it should be understood that these embodiments are offered by way of example only. Other embodiments may include, for example, different methods of patterning or etching various layers as well as different methods of application of imaging layer 216. The invention is not limited to a particular embodiment, but extends to various modifications, combinations, and permutations that nevertheless fall within the scope and spirit of the appended claims.

What is claimed is:

1. A method of fabricating an integrated circuit, the method comprising:

depositing an inorganic hard mask/anti-reflective coating over a layer of polysilicon;

depositing an imaging layer over the anti-reflective coating, the imaging layer including silicon;

patterning the imaging layer;

trim etching the inorganic hard mask/anti-reflective coating to form a pattern that is smaller than the pattern imaged by imaging layer; and removing portions of the polysilicon layer using the pattern formed from the removed portions of anti-reflective coating.

2. The method of claim 1, wherein the step of depositing the imaging layer comprises spin applying a layer of material containing silicon.

3. The method of claim 1, wherein the patterning step includes exposing and developing the image layer.

4. The method of claim 1, wherein the step of removing portions of the anti-reflective coating comprises providing an isotropic etch to the anti-reflective coating.

5. The method of claim 1, wherein the anti-reflective coating includes an inorganic material.

6. The method of claim 1, wherein the remaining portions of the polysilicon layer is a gate structure.

7. The method of claim 1, further comprising removing the imaging layer.

8. The method of claim 1, wherein the imaging layer is removed by selective etch or wet stripping.

9. A method of forming a gate in an integrated circuit, the method comprising:

providing a gate material layer;

providing a hard mask layer over the gate material layer;

providing an image layer including silicon over the hard mask layer;

patterning the image layer;

etching the hard mask layer with an undercutting technique; and etching the gate material layer to form gate structures.

10. The method of claim 9, wherein the hard mask layer is an inorganic anti-reflective coating (ARC).

11. The method of claim 9, wherein the gate structures have a critical dimension of 30–100 nm.

12. The method of claim 9, wherein the step of etching the hard mask layer comprises an undercutting isotropic etch.

13. The method of claim 9, wherein the step of providing an imaging layer comprises spin coating the hard mask layer with a silicon-containing material.

14. The method of claim 9, further comprising removing the image layer and thereby further reducing a width of a feature defining the gate structure.

15. A method of preventing resist erosion and pattern collapse during a trim etch process in the manufacture of a gate structure, the method comprising:

depositing an inorganic hard mask material layer over a polysilicon layer;

providing a silicon-containing imaging layer over the inorganic hard mask material layer;

patterning the silicon-containing imaging layer according to a pattern of gate structures;

removing portions of the inorganic hard mask material layer uncovered by the patterned imaging layer, the inorganic hard mask material layer having a pattern with widths less than witdths of the pattern of the imaging layer; and removing portions of the polysilicon layer uncovered by the unremoved portions of the inorganic hard mask material layer to form gate structures.

16. The method of claim 15, wherein the step of providing a silicon-containing imaging layer over the inorganic hard mask material layer comprises spin applying the silicon-containing imaging layer.

17. The method of claim 15, further comprising removing the silicon-containing imaging layer with a hydrofluoric (HF) dip.

18. The method of claim 15, wherein the patterned silicon-containing imaging layer includes apertures having a width of 30–100 nm.

19. The method of claim 15, further comprising doping a substrate below the polysilicon layer to form active regions.

20. The method of claim 19, further comprising forming spacers proximate lateral sides of the gate structures.

* * * * *